United States Patent [19]
Eckels et al.

[11] Patent Number: 6,011,456
[45] Date of Patent: Jan. 4, 2000

[54] SUPERCONDUCTING MAGNET SPLIT CRYOSTAT CRYOGEN RIDE-THROUGH RESERVE

[76] Inventors: Phillip W. Eckels, 3322 Ebenezer Chase Dr., Florence, S.C. 29501-8006; David Jonathan Chalk, 6210 Venture Ct., Slatington, Pa. 18080; Thomas Joseph, 3065 Magnolia Cr., Macungie, Pa. 18062; Joseph Anthony Schillinger, 221 Krocks Rd., Allentown, Pa. 18104

[21] Appl. No.: 09/223,123

[22] Filed: Dec. 30, 1998

[51] Int. Cl.[7] ........................................ H01F 1/00
[52] U.S. Cl. .................. 335/300; 505/892; 505/897; 62/50.1
[58] Field of Search ................... 335/216, 299, 335/300; 324/318, 319, 320; 505/888, 890, 891, 892, 893, 894, 895, 896, 897, 898, 899; 62/50.1, 50.2, 50.4, 50.7, 52.1

[56] References Cited

U.S. PATENT DOCUMENTS

| | | | |
|---|---|---|---|
| 4,745,760 | 5/1988 | Porter | 62/55 |
| 4,783,634 | 11/1988 | Yamamoto et al. | 335/300 |
| 5,448,214 | 9/1995 | Laskaris | 335/301 |

*Primary Examiner*—Lincoln Donovan
*Attorney, Agent, or Firm*—Irving M. Freedman; Christian G. Cabou; Phyllis Y. Price

[57] ABSTRACT

An open architecture recondensing superconducting magnet utilizing an upper and lower cryogen vessel connected by a passageway which extends above the bottom of upper cryogen vessel to discontinue the flow of liquid cryogen through the passageway to reserve liquid cryogen in the upper cryogen vessel when the cryogen level falls to provide an increased ride-through period in the event of a depleting liquid cryogen supply due to failure of the cryogen gas recondenser. A signal is provided to indicate the need to correct the failure.

18 Claims, 2 Drawing Sheets

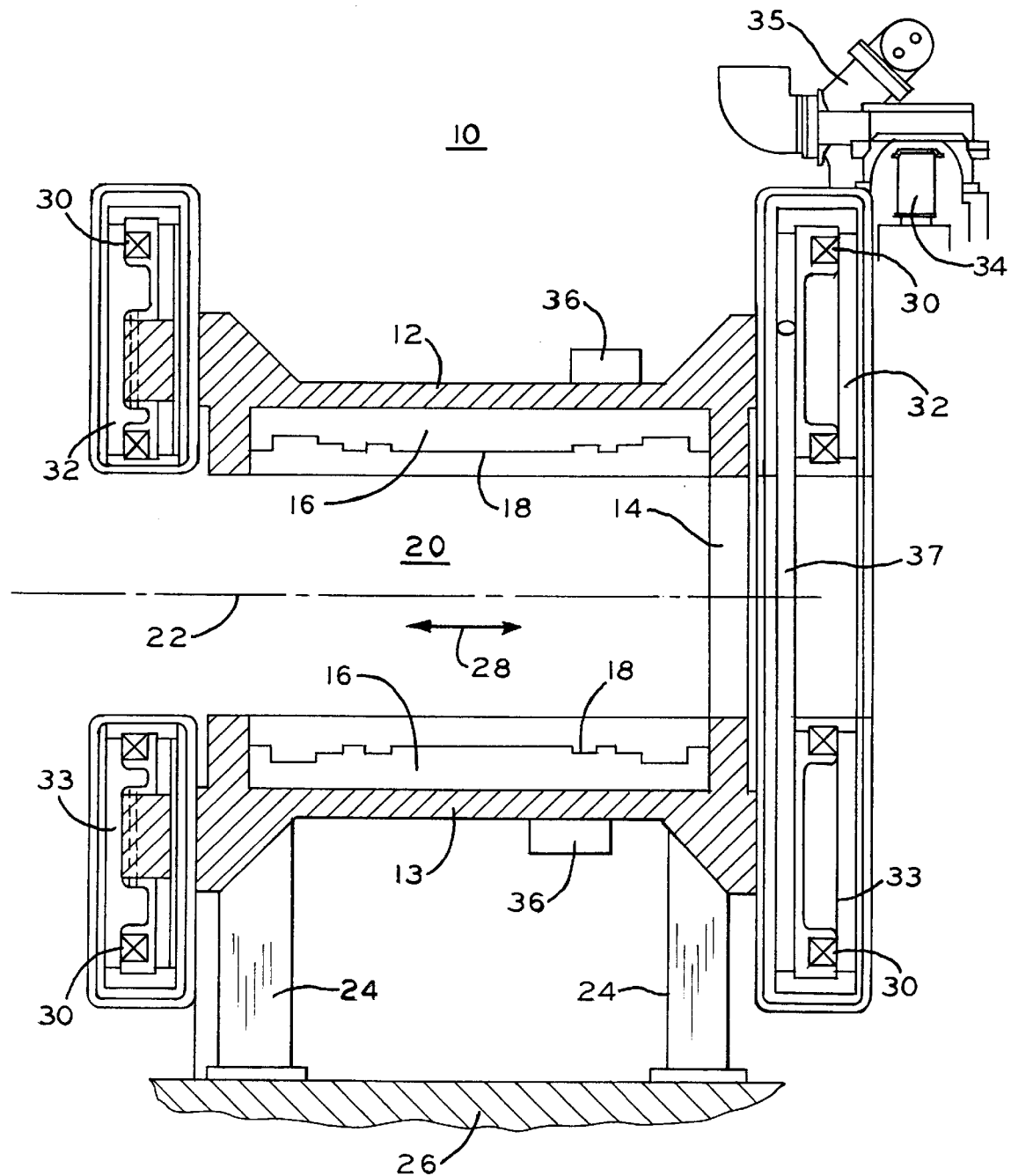
FIG_1

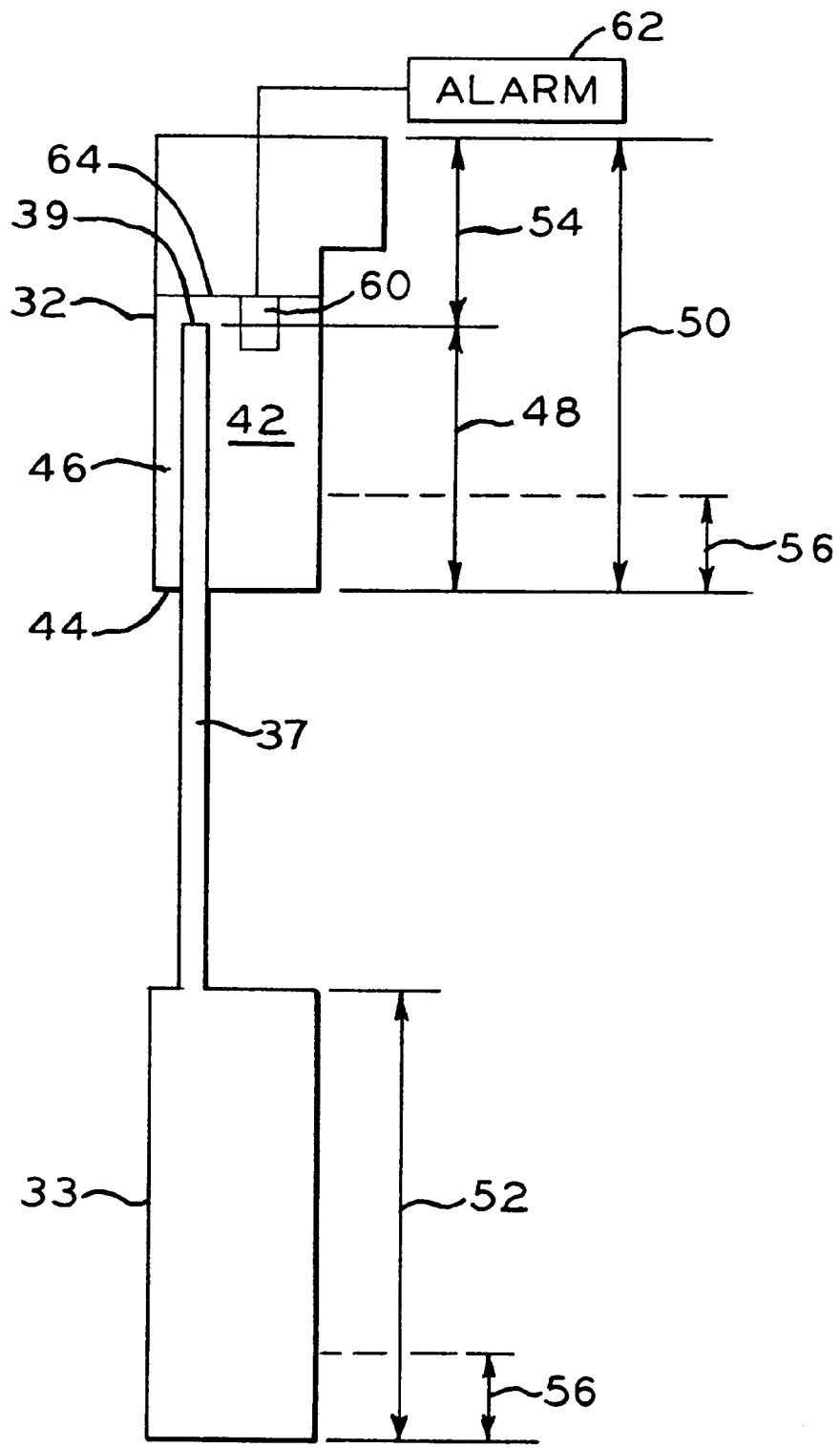
FIG_2

SUPERCONDUCTING MAGNET SPLIT CRYOSTAT CRYOGEN RIDE-THROUGH RESERVE

BACKGROUND OF INVENTION

This invention relates to a split cryostat superconducting magnet having a cryogen reserve to extend the superconducting ride-through period.

As is well known, a superconducting magnet can be made superconducting by placing it in an extremely cold environment, such as by enclosing it in a cryostat or pressure vessel containing liquid helium or other cryogen. The extreme cold ensures that the magnet coils can be made superconducting, such that when a power source is initially connected to the coil (for a relatively short period) current continues to flow through the coils even after power is removed due to the absence of resistance, thereby maintaining a strong magnetic field. Superconducting magnets find wide application in the field of Magnetic Resonance Imaging (hereinafter MRI).

Another problem encountered by conventional and early MRI equipments is that they utilize solenoidal magnets enclosed in cylindrical structures with a central bore opening for patient access. However, in such an arrangement, the patient is practically enclosed in the warm bore, which can induce claustrophobia in some patients. The desirability of an open architecture magnet in which the patient is not essentially totally enclosed has long been recognized. Unfortunately, an open architecture structure poses a number of technical problems and challenges.

One type of open architecture superconducting magnet utilizes a split dewar or split liquid helium vessels with the lower helium vessel and the upper helium vessel connected by a helium passageway or transfer to be to enable gravity flow of helium between the split helium vessels. A single helium recondenser is connected to the upper helium vessel to receive the boiled helium gas from both vessels for recondensing back to liquid helium which is flowed into the upper helium vessel and by gravity through the vertical transfer tube to the lower helium vessel. A loss of sufficient liquid helium in either vessel can cause highly undesirable quenching or discontinuance of superconducting operation of the magnet. Replenshing the liquid helium supply followed by restarting superconducting operation is expensive in terms of cost and down time of the MRI equipment. Such a loss of liquid helium can result, for example, from failure of the mechanical cryocooler associated with the helium recondenser. The cryocooler is typically positioned in a sleeve which enables cryocooler replacement without opening the helium vessels to the outside. However, replacement of the cryocooler must be made in the period after the problem is detected and before superconducting operation ceases. This period is known as the ride-through period during which the final period of superconducting magnet operation continues before quenching of the magnet.

It is highly desirable to be able to extend the ride-through period to provide sufficient time for detection and correction of the problem such as by replacement of the cryocooler.

SUMMARY OF INVENTION

Thus, there is a particular need for a system to extend the ride through period of a superconducting magnet to provide additional time to correct the problem and avoid the aforementioned magnet quench problems.

In accordance with one form of the invention, an open recondensing architecture superconducting magnet includes an upper and lower separated cryogen vessel each including superconducting magnet coils and liquid cryogen with a passageway connecting the vessels. A control tube in the upper vessel is positioned above the level of liquid helium at which quenching of superconducting operation occurs to discontinue replenishing liquid helium in the lower vessel upon failure of the recondenser operation in order to maintain a reserve helium supply in the upper vessel to extend the ride-through time period during which superconducting operation continues enabling replacement or repair of the recondenser or other problem.

More particularly, the upper end of the control tube retains a reservoir of approximately 12 times the liquid helium needed to continue and extend superconducting operation.

DESCRIPTION OF DRAWINGS

FIG. 1 is a simplified cross-sectional side view of a superconducting magnet including the subject invention.

FIG. 2 is an enlarged view of a portion of FIG. 1 showing details useful in explaining the operation of the invention.

DESCRIPTION OF INVENTION

Referring to FIGS. 1 and 2, open architecture superconducting magnet 10 includes spaced parallel pole pieces 12 and 13 separated and supported at one end by a pair of non-magnetic connecting members or posts 14. Pole pieces 12 and 13 are of ferromagnetic material such as iron. Pole faces 16 are shaped 18 to improve magnetic field homogeneity within imaging region 20 along axis 22 of superconducting magnet 10. Supports 24 secure magnet 10 to floor 26.

The main magnetic field, Bo, indicated generally by arrow 28 within imaging region 20 is generated by magnet coils shown generally as 30 within helium vessels 32 and 33. Magnetic field shimming apparatus such as correction coils (not shown) within cryogen vessels 32 and passive shims in external shim drawers indicated generally as 36 compensate for magnetic field inhomogeneities within imaging region 20 in the manner well known in the art. A recondenser 34 and associated mechanical cryocooler 35 (which may be a 2 stage Gifford-McMahon cryocooler) recondenses helium gas which results from the superconducting operation back to liquid helium. The recondensed liquid helium flows from recondenser 34 by gravity into upper helium vessel 32. A vertical transfer tube 37 interconnects helium vessels 32 and 33 and enables he gravity flow of helium from upper helium vessel 32 and lower helium vessel 33.

Transfer tube 37 extends into upper helium vessel 32 forming a control tube portion 42 extending above bottom 44 of the upper helium vessel through which liquid helium will flow between the upper helium vessel and lower helium vessel 33 when the height of level of liquid helium in the upper helium vessel is above the open upper end or opening 39 of control tube 42 of transfer tube 37. The height of opening 39 is 55 to 65 percent above bottom 44 of upper helium vessel 32, with 60 percent being desirable. The retained volume of liquid helium in upper helium vessel 32 is preferably proportional to the ratio of the heat leakage into the upper helium vessel and lower helium vessel 33, with 60% corresponding to equal upper and lower helium vessel heat leaks. Liquid helium 46 level is detected by liquid level detector 60 which is connected to alarm 62 which may include an indicator and an audible alarm to signal when the liquid helium level falls to a preselected level such as 64 to indicate the need to check for the cause of the decreased level of liquid helium.

Control tube 42 retains liquid helium 46 in upper helium vessel 32 in the event of a problem causing decreased helium in superconducting magnet 10. This prevents the rapid depletion of liquid helium 46 from the upper helium vessel in flowing to the lower helium vessel 33 in case superconducting operation of either helium vessel is threatened such as by failure of cryocooler 35 and cessation of recondensing operation of recondenser 34. Superconducting operation of the magnet coils 30 within both helium vessels 32 and 33 will then continue for a period of time or ride-through period. The discontinuance of superconducting operation of coils 30 within either helium vessel 32 or 33 will render superconducting magnet 10 unstable and unsuitable for MRI imaging, and the quenching and magnetic field collapsing of either helium vessel will adversely affect and hasten quenching of coils 30 within the other vessel. There is thus a need to maintain all of coils 30 superconducting for as long as possible to lengthen the ride-through period of superconducting operation to enable adequate time for repairs such as by replacement of cryocooler 35.

The proper selection of the optimum height of control tube 42 balances the need for superconducting operation of the coils within both upper helium vessel 32 and lower helium vessel 33. Referring to FIG. 2, height 48 of control tube 42 involves the following considerations in which the interior volume of both the upper helium vessel 32 and the lower helium vessel 33 are equal. That is, $V_{32}=V_{33}$. To the extent they are not the calculations can be scaled. Assuming a case in which it is determined that either helium vessel 32, 33 will quench or begin to quench and cease superconducting operation when the liquid helium 46 level 64 falls below 5%. That is, quench occurs for helium levels in the range of approximately 0–5%.

If, by way of example, recondenser 34 ceases operation upon a failure of cryocooler 35, with both helium vessels 32, 33 full, 50% of the total volume of liquid helium in superconducting magnet 10 will be present in each helium vessel. In the case of upper helium vessel 32, if control tube height 48 is positioned such that 60% of the volume of the upper helium vessel is below opening 39, the distribution of the total helium volume will be 50% in lower helium vessel 33 as indicated by arrow 52, 30% of which is below opening 39 of control tube 42 as indicated by arrow 48, and 20% is above opening 39 as indicated by arrow 54.

Thus, with the volumes 50 and 52 being equal at zero time ($T_0$) of failure of recondenser 34, continued superconducting operation will cause continued boiling of helium 46 in both helium vessels 32, 33. As helium gas increases without any recondensing back to liquid helium, the liquid helium level will initially, begin to rapidly fall in upper helium vessel 32 because it would represent the total helium boiloff of both helium vessels 32, 33 with the boiloff in lower helium vessel 33 being replaced by liquid helium 46 from upper helium vessel 32 through tubing or pipe 37 to atempt to maintain lower helium vessel 33 full. That is, helium level volume 50 in upper helium vessel 32 will substantially decrease at the rate of approximately twice the boiloff of either helium vessel.

However, the height of control tube 42 allows this lower helium vessel helium replacement action only until helium level 64 reaches opening 39 after which the control tube prevents the further rapid decrease in volume in upper helium vessel 32 retaining a reservoir in upper helium vessel 32.

At the time when, or at a predetermined time before helium liquid level 64 drops to opening 39 of control tube 42, alarm 62 will be actuated by liquid level detector 60 to warn the operator that corrective action such as replacement of cryocooler 35 must be immediately undertaken. When helium level 64 reaches opening 39 transfer tube 37 will be effectively inoperative and helium will cease flowing from upper helium vessel 32 to lower helium vessel 33 providing a liquid helium reservoir enabling an effective ride-through period determined by the time it takes for the helium volume to decrease to 20% in both vessels which is longer than that provided without control tube 42. The stopping of further depletion of liquid helium in upper vessel 32 and the effective separation of helium vessels 32, 33 lengthens the ride-through period. Since liquid helium is no longer being transferred from upper helium vessel 32 to maintain lower helium vessel 33 full such that the time needed for helium 46 level to fall from 60% of the volume within the upper vessel to 5% of the volume due to helium boiloff from only the upper helium vessel is twice the time than would occur if the upper vessel continued to refill the lower helium vessel to a level higher than needed to maintain superconducting operation of the lower helium vessel.

The additional time provided by the continued superconducting operation of coils 30 within both helium vessels 32 and 33 is important in enabling the servicing and/or replacement or cryocooler 35 and/or other repairs and the resumption of the recondensing action of recondenser 34 to recondense and convert accumulated helium gas back to liquid helium to enable the resumption of normal superconducting operation of magnet 10. Liquid helium could also be added to superconducting magnet 10 at this time if required.

While the optimum height 48 of control tube 42 may vary from magnet to magnet depending on specific dimensions, it will be significantly higher than the quench level of coils 30 of upper helium vessel 32 since it is this difference that provides the extra ride-through time before quench of the upper helium vessel. Control tube 42 may consist of more than one tube, all extending to the same height above bottom 44 of upper helium vessel 32.

While the present invention has been described with respect to certain preferred embodiments thereof, it is to be understood that numerous variations in the details of construction, the arrangement and combination of parts, and the types of materials used may be made without departing from the spirit and scope of the invention.

What is claimed is:

1. An open architecture recondensing cryogen superconducting magnet including an upper and lower vertically spaced cryogen vessel with the upper cryogen vessel spaced from and overlying said lower cryogen vessel each including superconducting magnet coils and a liquid cryogen supply to provide a magnetic field therebetween, apparatus to prolong the period of time of superconducting ride-through operation comprising:

a recondenser to recondense cryogen gas back to liquid cryogen connected to said upper cryogen vessel to replenish said liquid helium; and at least one passageway connecting the interior of said upper cryogen vessel and the interior of said lower cryogen vessel;

said passageway including an opening at a preselected height above the bottom of said upper cryogen vessel;

said passageway enabling the transfer of said liquid cryogen from said upper cryogen vessel to said lower cryogen vessel as long as the level of said liquid cryogen in said upper vessel is above said opening after which gravity flow between the upper vessel and lower vessel is discontinued through said passageway;

said height being above the level of liquid cryogen below which said superconducting operation of said magnet coils in said upper cryogen vessel quenches;

whereby the ride-through period of continued operation of said superconducting magnet in both the upper and lower cryogen vessel in the event of failure of the liquid helium recondensing can be extended by discontinuing said transfer of said liquid cryogen to said lower cryogen vessel at a level determined by the said preselected height.

2. The superconducting magnet ride-through control apparatus of claim 1 wherein said liquid cryogen is helium.

3. The superconducting magnet ride-through control apparatus of claim 2 wherein said liquid cryogen transfer is by gravity flow.

4. The superconducting magnet ride-through control apparatus of claim 3 wherein said preselected height of said opening is in the range of 55 to 65% of the vessel height above the bottom of said upper cryogen vessel.

5. The superconducting magnet ride-through control apparatus of claim 4 wherein said preselected height retains approximately twelve times the volume of helium needed to avoid quenching of superconducting operation.

6. The superconducting magnet ride-through control apparatus of claim 5 wherein a helium level detector and an alarm are provided for said upper helium vessel to indicate when the detected helium level falls to a preselected level.

7. The superconducting magnet ride-through control apparatus of claim 6 wherein helium boiloff from both of said cryogen vessels during superconducting operation is recondensed by said recondenser and returned to said upper cryogen vessel.

8. The superconducting magnet ride-through control apparatus of claim 7 wherein the extension of said passageway is a tube, the extension of which into said upper cryogen vessel holds back a reserve pool of helium within said upper cryogen vessel from flowing to said lower cryogen vessel during said ride-through period.

9. An open architecture liquid helium cooled superconducting magnet comprising:

an upper helium vessel including superconducting magnet coils;

a lower helium vessel vertically separated from said upper helium vessel with each including superconducting magnet coils to provide a magnetic field in the space therebetween;

at least one upright transfer tube extending down from said upper helium vessel to said lower helium vessel providing helium gravity flow from said upper helium vessel to said lower helium vessel;

liquid helium replenishment means for said helium vessels connected to said upper vessel;

said tube extending into said upper helium vessel above the bottom of said upper helium vessel to allow helium flow from said upper helium vessel to said lower helium vessel only when the level of helium in said upper vessel is above the upper end of said tube;

wherein the height of said tube above said bottom of said upper helium vessel discontinues helium flow between the vessels and holds back a reservoir of helium in said upper helium vessel sufficient to extend the ride-through period of time of superconducting operation of said magnet during periods in which said liquid helium replenishment means ceases and said helium level in said upper helium vessel falls below said upper end of said tube.

10. The superconducting magnet ride-through control apparatus of claim 9 wherein the height of the top of said tube above said bottom of said upper helium vessel is selected to maximize the time of said ride-through period of said superconducting magnet before quenching will occur to maximize the time available for corrective action to avoid quenching.

11. The superconducting magnet ride-through control apparatus of claim 10 wherein said height of said tube above said bottom of said upper helium vessel retains liquid helium in said upper helium vessel from flowing to said lower helium vessel an amount equal to 80 to 20 percent of the helium volume of said upper helium vessel.

12. The superconducting magnet ride-through control apparatus of claim 11 wherein said height retains 60% of said helium volume of said upper helium vessel from gravity flow to said lower helium vessel.

13. The superconducting magnet ride-through control apparatus of claim 12 wherein a helium recondenser connected to said upper helium vessel recondenses helium gas back to liquid helium.

14. The superconducting magnet ride-through control apparatus of claim 13 wherein the recondensed liquid helium is flowed back to said upper helium vessel.

15. The superconducting magnet ride-through control apparatus of claim 14 wherein the height of said top of said tube within said upper helium vessel is selcted to retain helium in said upper helium vessel to extend the ride-through period of both of the helium vessels.

16. The superconducting magnet ride-through control apparatus of claim 10 wherein said tube dicontinues flow of liquid helium from said upper vessel to said lower vessel when the volume of liquid helium retained is approximately twelve times that at which a quenching of superconducting operation of said magnet occurs.

17. The superconducting magnet ride-through control apparatus of claim 10 wherein there are a plurality of said transfer tubes.

18. The superconducting magnet ride-through control apparatus of claim 4 wherein there are a plurality of said passageways including openings at a preselected height above the bottom of said upper cryogen vessel.

* * * * *